(12) United States Patent
Yamamoto et al.

(10) Patent No.: US 8,016,982 B2
(45) Date of Patent: Sep. 13, 2011

(54) SPUTTERING APPARATUS AND SPUTTERING METHOD

(75) Inventors: Masahiro Yamamoto, Osaka (JP);
Takeshi Koiwasaki, Osaka (JP); Isao Muragishi, Osaka (JP); Hitoshi Yamanishi, Osaka (JP)

(73) Assignee: Panasonic Corporation, Osaka (JP)

( * ) Notice: Subject to any disclaimer, the term of this patent is extended or adjusted under 35 U.S.C. 154(b) by 526 days.

(21) Appl. No.: 12/272,834

(22) Filed: Nov. 18, 2008

(65) Prior Publication Data
US 2009/0139853 A1 Jun. 4, 2009

(30) Foreign Application Priority Data

Nov. 30, 2007 (JP) ................ 2007-309768
Aug. 29, 2008 (JP) ................ 2008-221602

(51) Int. Cl.
*C23C 14/00* (2006.01)
*C23C 14/32* (2006.01)
(52) U.S. Cl. ............... 204/192.1; 204/298.16
(58) Field of Classification Search ........... 204/192.1, 204/298.16
See application file for complete search history.

(56) References Cited

U.S. PATENT DOCUMENTS

| | | |
|---|---|---|
| 4,964,968 A | 10/1990 | Arita |
| 5,262,028 A | 11/1993 | Manley |
| 5,415,754 A | 5/1995 | Manley |
| 6,416,639 B1 * | 7/2002 | De Bosscher et al. ..... 204/298.2 |

FOREIGN PATENT DOCUMENTS

| | | |
|---|---|---|
| JP | 7-507360 A | 8/1995 |
| JP | 11-500490 A | 1/1999 |
| JP | 3473954 B2 | 9/2003 |
| WO | 93/24674 | 12/1993 |
| WO | 95/12003 | 5/1995 |

* cited by examiner

*Primary Examiner* — Stephen Rosasco
(74) *Attorney, Agent, or Firm* — Greenblum & Bernstein, P.L.C.

(57) ABSTRACT

The present invention is to provide a sputtering apparatus and a sputtering method, specifically, a magnetron sputtering apparatus having a magnetron electrode capable of generating plasma in a wide region near the surface of a target, and a sputtering method using the apparatus. Thereby, a magnetic field shape enabling to generate plasma in a wide region near the surface of a target is realized, the use efficiency of the target material is increased, and dusts and abnormal electric discharges may be prevented. Magnetic circuit 10 of a magnetron electrode is set as "magnetic circuit 10 in which center perpendicular magnet 101, inside parallel magnet 103, outside parallel magnet 104, and perimeter perpendicular magnet 102 are arranged" from the central part of target 2 toward the perimeter part, and inside parallel magnet 103 is brought close to target 2.

8 Claims, 14 Drawing Sheets

| | |
|---|---|
| Interval D4 between magnet 101 and the surface of target 2 | 35 mm |
| Width of magnet 101 | 5 mm |
| Interval D3 between magnet 102 and the surface of target 2 | 40 mm |
| Interval D1 between magnet 103 and the surface of target 2 | 22 mm |
| Interval D2 between magnet 104 and the surface of target 2 | 32 mm |
| Width of magnet 103 and magnet 104 | 10 mm |
| Thickness of magnet 103 and magnet 10 | 8 mm |
| Yoke 105 | 10 mm flat plate |

SPUTTERING APPARATUS AND SPUTTERING METHOD

CROSS REFERENCE TO RELATED APPLICATIONS

This application claims foreign priorities based on application number JP2007-309768 filed on Nov. 30, 2007, and JP2008-221602 filed on Aug. 29, 2008. The entire content disclosed in the specification, drawings and abstracts of the aforementioned applications is incorporated herein by reference in its entirety.

BACKGROUND OF THE INVENTION

1. Field of the Invention

The present invention relates to a sputtering apparatus and a sputtering method.

2. Description of the Related Art

Sputtering is a technology in which a substrate and a target (a member to become the raw material of a sputtering film) are arranged in vacuum, and plasma is generated in the vacuum and a film is formed on the substrate. According to the sputtering using plasma, because sputtered particles of high energy reach the substrate, adhesion of the sputtered particles with the substrate becomes high. Therefore, the sputtering using plasma has an advantage that a precise film can be formed, and is used in the mass production of many products such as electronic components and optical thin films and the like.

Further, in a magnetron sputtering among sputterings, a magnetic circuit is placed in the back surface of a target and a magnetic tunnel is formed on the target surface. By trapping electrons by this line of magnetic force, ionization rate increases, high-density plasma is generated, and the film-forming speed can be increased. Therefore, the industrial use of the magnetron sputtering has been progressed rapidly.

However, in the magnetron sputtering, since a magnetic tunnel is localized on a small part on the target, plasma is localized, and a small part of the target is selectively eroded. In practice, only approximately 10 to 20% of the target is emitted by the sputtering. In order to solve this problem, there are proposed methods including a method to increase the use efficiency of the target by rotating a magnet arranged at the back surface of the target, a method to move a plasma generation region in time by oscillating a magnet arranged at the back surface of the target, a method to move plasma by an electromagnet or the like, and others. However, in these methods, since a moving unit is required to be added to a sputtering apparatus, a mechanism of the apparatus tends to become complicated and equipment costs also tend to become high.

On the other hand, a method is proposed in which as a measure to generate plasma in a wide region near the surface of the target while fixing the magnet arranged on the back surface of the target, "a magnetic circuit that is composed of a combination of a magnet magnetized perpendicularly to the target surface and a magnet magnetized in parallel thereto" is arranged on the back surface of the target (refer to Japanese Patent Application Laid-Open No. H07-507360, Japanese Patent Application Laid-Open No. H11-500490, and the U.S. Pat. No. 4,964,968).

SUMMARY OF THE INVENTION

As described in Japanese Patent Application Laid-Open No. H07-507360, Japanese Patent Application Laid-Open No. H11-500490, and the U.S. Pat. No. 4,964,968, when the magnetic circuit that is composed of a combination of the magnet perpendicularly magnetized to the target surface and the magnet magnetized in parallel thereto is used, plasma may be generated in a wide region near the surface of the target. On the other hand, for that purpose, it is required to narrow the interval between the magnetic circuit and the target to place them close to each other.

For example, a magnetron sputtering apparatus disclosed in the U.S. Pat. No. 4,964,968 has a magnetic circuit containing first to fourth magnets, but in order to generate plasma in a wide region near the surface of the target, it is necessary to arrange a magnetic lobe formed by each magnet in the sputtering region substantially. Therefore, the distance between the target and the magnetic circuit is required to be shortened, and it is necessary to install the magnetic circuit in the inside of a cooling channel for cooling the target. Since the magnetic circuit installed in the inside of the channel may be corroded by the cooling water, and magnetism and magnetic field shape may be changed in a long term use. Since this change affects the film-forming rate, in-plane homogeneity of the film thickness, and the like, it causes the quality deterioration of products, and yield degradation.

On the other hand, when the magnetic circuit is installed in the outside of the cooling channel, since the interval from the magnetic circuit to the target surface becomes long, it is difficult to arrange the magnetic lobe in the sputtering region, and the shape of the line of magnetic force in the vicinity of the target surface becomes a limited shape close to a magnetic loop by a simple double ring magnet, and there is a tendency that it is difficult to form a line of magnetic force in parallel to the target surface.

Therefore, with the technologies described in Japanese Patent Application Laid-Open No. H07-507360, Japanese Patent Application Laid-Open No. H11-500490, and the U.S. Pat. No. 4,964,968, it is difficult to generate plasma in a wide region near the surface of the target, and the material use efficiency is not improved sufficiently. Further, when the erosion area of the target becomes narrow, sputtered target molecules do not adhere to a film-formed body, and easily adheres to the target again (film re-adhesion). As a result, dusts or abnormal electric discharges are caused, and the quality of the sputter film to be manufactured may be deteriorated.

Accordingly, an object of the present invention is to provide a magnetron sputtering apparatus having a magnetron electrode capable of generating plasma in a wide region near the surface of a target, while a magnetic circuit is installed in the outside of a cooling channel. Thereby, another object is to provide a sputtering apparatus and a sputtering method that increase the use efficiency of a target material and control dusts and abnormal electric discharges.

The present inventors examined a magnetic circuit capable of forming plasma in a wide region near the target surface, with the use of a magnetic field simulation and a plasma simulation. First, as shown in FIG. 2, the basic form of a magnetic circuit to be arranged on the back surface of a target is made with a combination of "center perpendicular magnet 101 and perimeter perpendicular magnet 102 (perpendicular magnet unit) that are magnetized perpendicularly to the target surface, and inside parallel magnet 103 and outside parallel magnet 104 (parallel magnet unit) that are magnetized in parallel to the target surface". A magnetic circuit capable of generating plasma in a wide region near the surface of the target was examined by appropriately adjusting the magnetic arrangement positions and the like.

That is, a first aspect of the present invention relates to a sputtering apparatus shown below.

[1] A sputtering apparatus that has a vacuum chamber, a target arranged in the vacuum chamber, a magnetic circuit that is arranged on a back surface side of the target and contains a perpendicular magnet unit and a parallel magnet unit, and a substrate holder that is arranged on a front surface side of the target and can hold a substrate on which a sputter film is formed, and has the following characteristics.

First, the perpendicular magnet unit composed of a center perpendicular magnet and a perimeter perpendicular magnet; and directions of magnetic fields of both the center perpendicular magnet and the perimeter perpendicular magnet are roughly perpendicular to the target surface, and directions of magnetic fields of the center perpendicular magnet and the perimeter perpendicular magnet being opposite each other; and the center perpendicular magnet is installed in central part of a back surface of the target, and the perimeter perpendicular magnet is annularly installed in perimeter part of the back surface of the target so as to surround the center perpendicular magnet.

Next, the parallel magnet unit composed of an inside parallel magnet and an outside parallel magnet, and directions of magnetic fields of both the inside parallel magnet and outside parallel magnet are roughly parallel to the target surface, and directions of magnetic fields of the inside parallel magnet and the outside parallel magnet are the same each other; and both the inside parallel magnet and outside parallel magnet are annularly installed between the center perpendicular magnet and the perimeter perpendicular magnet so as to surround the center perpendicular magnet, and the inside parallel magnet is arranged in the position closer to a central side of the back surface of the target than the outside parallel magnet.

Further, when an interval between the inside parallel magnet and the surface of the target is defined as D1, an interval between the outside parallel magnet and the surface of the target is defined as D2, and an interval between the perimeter perpendicular magnet and the surface of the target is defined as D3, it is established that "D1<D2≦D3".

[2] In the apparatus of [1], interval D1 may be 30 mm or less.

[3] In the apparatus of [1] or [2], a water-cooling jacket arranged between the target and the magnetic circuit is further included; and the magnetic circuit may be arranged outside the water-cooling jacket.

[4] In the apparatus of [3], a concave space may be formed in part of the surface of the water-cooling jacket which is faced to the magnetic circuit, and the inside parallel magnet may be arranged in the concave space.

[5] In the apparatus of [4], the space formed in the part of the surface of the water-cooling jacket which is faced to the magnetic circuit is divided into plural spaces by slits, and the inside parallel magnet is arranged in each of the plural spaces, and thickness of the slits may be larger than the thickness of a portion of the water-cooling jacket in which the concave is formed, and the slits may constitute part of water channels of the water-cooling jacket.

The second aspect of the present invention relates to a sputtering apparatus described below.

[6] A sputtering apparatus that has a vacuum chamber, a target arranged in the vacuum chamber, a magnetic circuit that is arranged on a back surface side of the target and contains a perpendicular magnet unit and a parallel magnet unit, a substrate holder that is arranged on a front surface side of the target and can hold a substrate on which a sputter film is formed, and a water-cooling jacket arranged between the target and the magnetic circuit, and the sputtering apparatus has the following characteristics.

First, the perpendicular magnet unit composed of a center perpendicular magnet and a perimeter perpendicular magnet; and directions of magnetic fields of both the center perpendicular magnet and perimeter perpendicular magnet are roughly perpendicular to the target surface, and directions of magnetic fields of the center perpendicular magnet and the perimeter perpendicular magnet being opposite each other; and the center perpendicular magnet is installed in central part of a back surface of the target, and the perimeter perpendicular magnet is annularly installed in perimeter part of the back surface of the target so as to surround the center perpendicular magnet.

Next, the parallel magnet unit composed of an inside parallel magnet and an outside parallel magnet; and directions of magnetic fields of both the inside parallel magnet and outside parallel magnet are roughly parallel to the target surface, and directions of magnetic fields of the inside parallel magnet and the outside parallel magnet are the same each other; and both the inside parallel magnet and outside parallel magnet are annularly installed between the center perpendicular magnet and the perimeter perpendicular magnet so as to surround the center perpendicular magnet, and the inside parallel magnet is arranged in the position closer to a central side of the back surface of the target than the outside parallel magnet.

Further, a magnetic substance is installed inside the water-cooling jacket corresponding to the inside parallel magnet, or part of the water-cooling jacket corresponding to the inside parallel magnet is a magnetic substance.

The third aspect of the present invention relates to a sputtering method described below.

[7] A sputtering method using a sputtering apparatus according to any of [1] to [6], including a step of holding a film-formed body on the substrate holder; a step of introducing sputtering gas into the vacuum chamber of the sputtering apparatus; and a step of forming a sputtering film on the substrate by applying a voltage to a target arranged in the chamber to generate plasma.

According to the sputtering apparatus and the sputtering method of the present invention, a line of magnetic force may be generated nearly in parallel to a target surface in a wide region near the surface of the target, and thus electrons may be trapped in a wide region. Therefore, plasma may be generated in a wide region near the surface of the target, and the use efficiency of the target material can be increased. For example, according to the present invention, the use efficiency of the target material, which has been approximately 10 to 20% conventionally, may be improved up to approximately 40%.

Further, since sputtering may be carried out in a wide region near the target, film may be prevented from re-adhesion, and abnormal electric discharges may be controlled, and as a result, dusts may be reduced.

DESCRIPTION OF THE PREFERRED EMBODIMENTS

Figure 1:
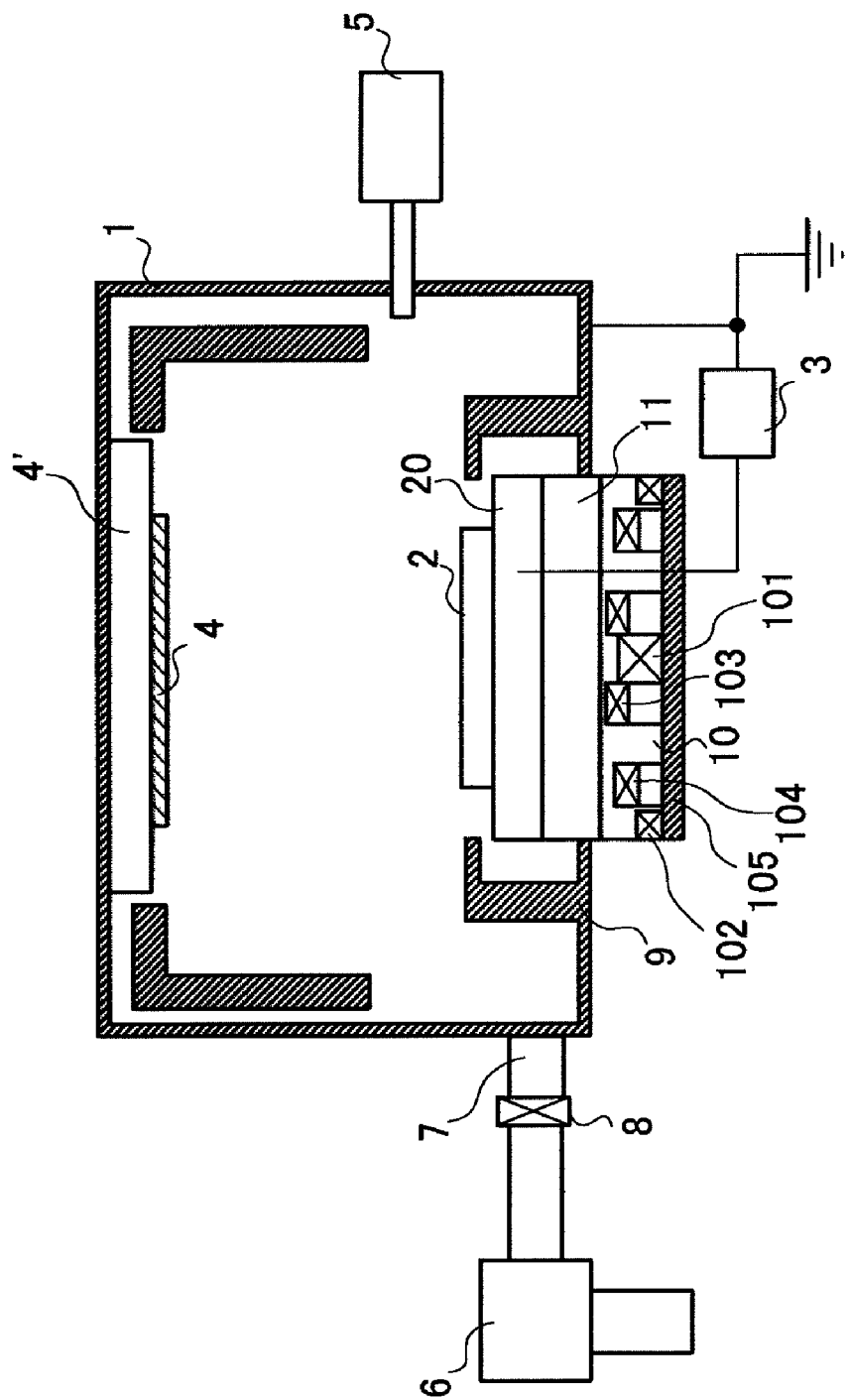
FIG. 1 is a figure showing the outline of an example (Embodiment 1) of a sputtering apparatus according to the present invention.

1. Sputtering apparatus according to the present invention:
The sputtering apparatus of the present invention is referred to as a magnetron sputtering apparatus. The magnetron sputtering apparatus has a vacuum chamber capable of being decompressed inside thereof, a magnetron electrode arranged in the inside of the vacuum chamber, and a substrate holder for holding a substrate on which a sputter film is formed (film-formed body) (refer to FIG. 1).

The magnetron electrode has a target used as a cathode, and a magnetic circuit arranged on the back surface side of the target. In addition, the magnetron electrode may have a water-cooling jacket for cooling the target and the like between the target and the magnetic circuit (refer to FIG. 1). The substrate holder is arranged on the front surface side (the opposite surface of the surface where the magnetic circuit is arranged) of the target. The shape of the magnetron electrode of the sputtering apparatus according to the present invention is not limited in particular, and it may be a disk shape, or a rectangular plate shape (refer to FIG. 2).

The magnetic circuit of the magnetron electrode according to the present invention contains a perpendicular magnet unit and a parallel magnet unit. FIG. 2 shows an example of the magnetic circuit, and is a top view seen from the normal line direction of the back surface of the target.

The perpendicular magnet unit is composed of center perpendicular magnet 101 and perimeter perpendicular magnet 102. Center perpendicular magnet 101 is arranged in the central part of the back surface of target 2, and perimeter perpendicular magnet 102 is arranged at the perimeter part of the back surface of target 2.

Center perpendicular magnet 101 arranged in the central part of target 2 is not required to be arranged at the center in a strict meaning, and it may be arranged in the central part of target 2 so that it should be surrounded with perimeter perpendicular magnet 102 and the magnets (magnets 103 and 104) that constitute the parallel magnet unit mentioned later herein.

Perimeter perpendicular magnet 102 arranged at the perimeter part of target 2 has a role to regulate the region in which plasma is generated. If perimeter perpendicular magnet 102 is arranged along with the perimeter of the target as much as possible, plasma may easily be generated over all the regions near the surface of target 2 and it is preferable, on the other hand, the risk of generating plasma in other regions than target 2 also increases. Therefore, the arrangement position of perimeter perpendicular magnet 102 is required to be arranged appropriately in the perimeter part.

Center perpendicular magnet 101 and perimeter perpendicular magnet 102 may be composed of one magnet (FIG. 2A), and may be composed of two or more magnets (FIG. 2B), respectively. As shown in FIG. 2B, when two or more magnets are constituted in combination, it may be preferable because the manufacture costs are advantageous or the adjustment of the magnetic circuit is easy.

In addition, each magnet may be inserted in a holder composed of a nonmagnetic material, or may be fixed to a nonmagnetic material. In this case, since a screw hole for fixing the magnet and the like may be prepared, there is an advantage that the adjustment of the magnetic circuit is easy to carry out.

The directions of the magnetic fields of both center perpendicular magnet 101 and perimeter perpendicular magnet 102 are perpendicular to the surface of target 2. The term "perpendicular" herein does not mean that the crossing angle is strictly 90 degrees.

Further, the direction of the magnetic field of center perpendicular magnet 101 and the direction of the magnetic field of perimeter perpendicular magnet 102 are opposite each other. In other words, when the target side of center perpendicular magnet 101 is S pole, the target side of perimeter perpendicular magnet 102 is N pole; and when the target side of center perpendicular magnet 101 is N pole, the target side of perimeter perpendicular magnet 102 is S pole.

That is, preferably, the line of magnetic force connecting center perpendicular magnet 101 and perimeter perpendicular magnet 102 exists so as to cover the surface of target 2.

The parallel magnet unit is composed of inside parallel magnet 103 and outside parallel magnet 104. Both inside parallel magnet 103 and outside parallel magnet 104 are annularly arranged so as to surround center perpendicular magnet 101, and arranged in the position closer to central part than perimeter perpendicular magnet 102. In other words, the parallel magnet unit is sandwiched in between center perpendicular magnet 101 and perimeter perpendicular magnet 102.

In addition, both inside parallel magnet 103 and outside parallel magnet 104 are annularly arranged, and inside parallel magnet 103 is arranged at the central side, that is, in the vicinity of center perpendicular magnet 101.

The directions of both the magnetic fields of inside parallel magnet 103 and outside parallel magnet 104 are parallel to the target surface. The term "parallel" herein does not mean that the crossing angle is strictly 0 degree.

Further, the directions of the magnetic field of inside parallel magnet 103 and the direction of the magnetic field of outside parallel magnet 104 are the same each other. In other words, when the perimeter side of inside parallel magnet 103 is S pole, the perimeter side of outside parallel magnet 104 is also S pole; and when the perimeter side of inside parallel magnet 103 is N pole, the perimeter side of outside parallel magnet 104 is also N pole.

In the same manner as perpendicular magnets (101 and 102), inside parallel magnet 103 and outside parallel magnet 104 may be composed of one magnet, or may be composed of two or more magnets, respectively. In addition, each magnet may be inserted into a holder composed of a nonmagnetic material, or may be fixed to a nonmagnetic material.

Figure 2A:
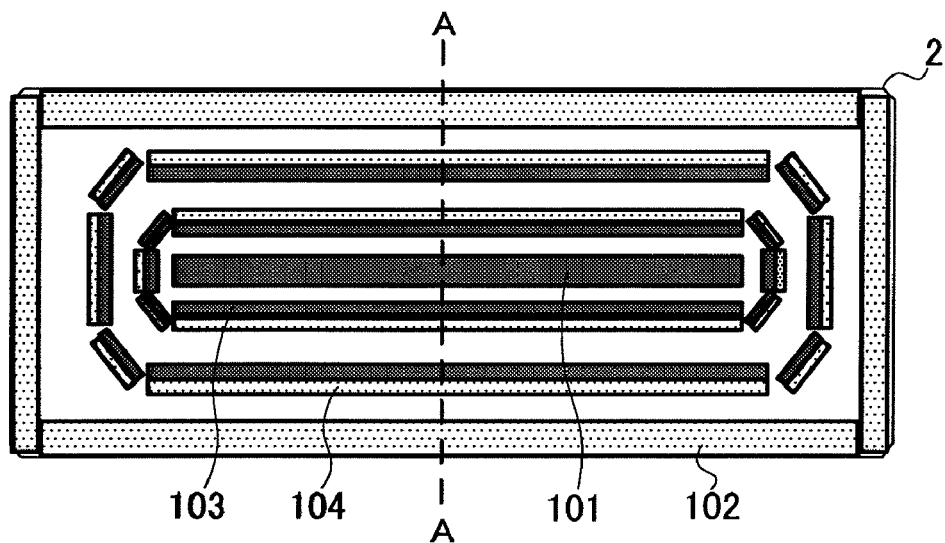
FIG. 2 is a top view showing the outline of an example of a magnetic circuit of a sputtering apparatus according to the present invention.
Figure 2B:
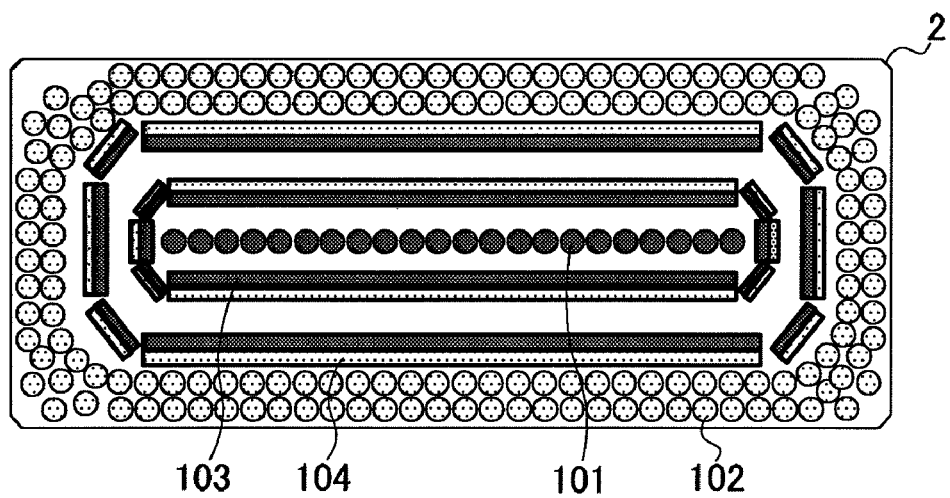
Figure 3:
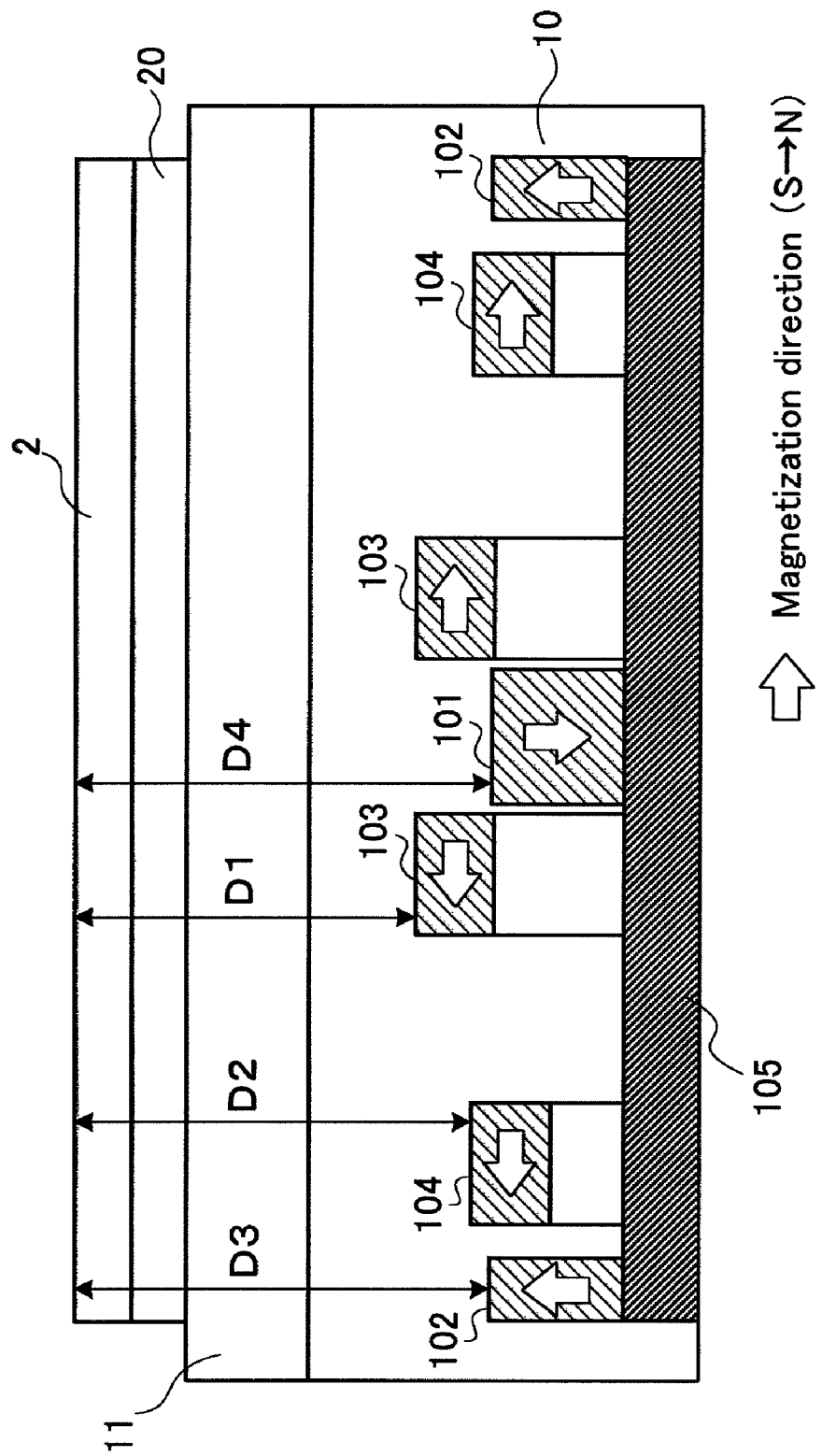
FIG. 3 is a cross sectional view showing the outline of an example of a magnetic circuit of a sputtering apparatus according to the present invention.

FIG. 3 is a cross sectional view at A-A in FIG. 2A (the arrow in FIG. 3 shows the magnetization direction (S→N)). As shown in FIG. 3, center perpendicular magnet 101 is arranged in the central part of target 2. And toward the perimeter part from the central part of target 2, center perpendicular magnet 101, inside parallel magnet 103, outside parallel magnet 104, and perimeter perpendicular magnet 102 are arranged in this order. Preferably, center perpendicular magnet 101 and perimeter perpendicular magnet 102 are connected and fixed to yoke 105. On the other hand, inside parallel magnet 103 and outside parallel magnet 104 are not connected to yoke 105.

The magnetic circuit is arranged at the back surface side of target 2. Target 2 may be held by packing plate 20. Preferably, water-cooling jacket 11 is arranged between target 2 and magnetic circuit 10. Water-cooling jacket 11 has a function to cool target 2.

One of the important characteristics of the present invention is that the intervals between respective magnets (magnets 101 to 104) that constitute magnetic circuit 10 and the surface of target 2 are adjusted appropriately. That is, preferably, when the interval between inside parallel magnet 103 and the surface of target 2 is defined as D1; the interval between outside parallel magnet 104 and the surface of target 2 is defined as D2; and the interval between perimeter perpendicular magnet 102 and the surface of target 2 is defined as D3, the relation of "D1<D2≦D3" is satisfied.

However, as mentioned later, "the interval D1 between inside parallel magnet 103 and the surface of target 2" may mean (1) the interval between magnet 103 itself and the surface of target 2, or mean, (2) when there is a magnetic substance that is arranged in the vicinity of magnet 103 and constitutes a magnetic circuit together with magnet 103 (refer to numeral 13 in FIG. 14), the interval between the magnetic substance and the surface of target 2. The magnetic substance constituting a magnetic circuit together with magnet 103 may be arranged in the inside of water-cooling jacket 11, or may be part of the materials of the water-cooling jacket.

On the other hand, there is no particular restriction in the degree of the interval D4 between center perpendicular magnet 101 and the surface of target 2.

As described previously, magnetic circuit 10 arranged at the back surface side of target 2 generate a magnetic field on the surface of target 2. Among the surfaces of target 2, the region in which a suitable magnetic field is formed tends to be sputtered and consumed with magnetic circuit 10. The term "suitable magnetic field" herein means a magnetic field that is formed on the surface of target 2, and is in the direction as parallel as possible to the surface of target 2. A magnetic field in the direction as parallel as possible to the surface of target 2 is, that is, a magnetic field in the direction perpendicular to the direction of the electric field occurring in the sputtering apparatus. By the magnetic field in the direction perpendicular to the direction of the electric field, a magnetron discharge occurs, plasma is easily generated, and the use efficiency of target materials is increased.

The present inventor, while controlling the configuration of the magnetic circuit, that is, factors such as: interval D1, interval D2, interval D3 and interval D4; thickness t of the yoke; the width of the respective magnets; and the like, conducted a simulation of the magnetic field (vector of the line of magnetic force of the magnetic field), a simulation of plasma (distribution of the generated plasma), and a simulation of erosion shapes of the target and the like. Respective intervals D1 to D4 were set 17 mm or more, in order to arrange the respective magnets that constitute the magnetic circuit in the outside of the water-cooling jacket.

While controlling the respective factors, the combination of analysis conditions was determined based on an orthogonal table and the results were subjected to an analysis of variance, as a result, the present inventors optimized the respective factors.

First, the present inventors have found that in order to generate plasma in a wide region near the surface of the target, interval D1 between inside parallel magnet 103 and the surface of target 2 is important, that is, preferably, interval D1 is smaller than the intervals between the other magnets and the surface of target 2 (intervals D2 to D4).

Figure 4:
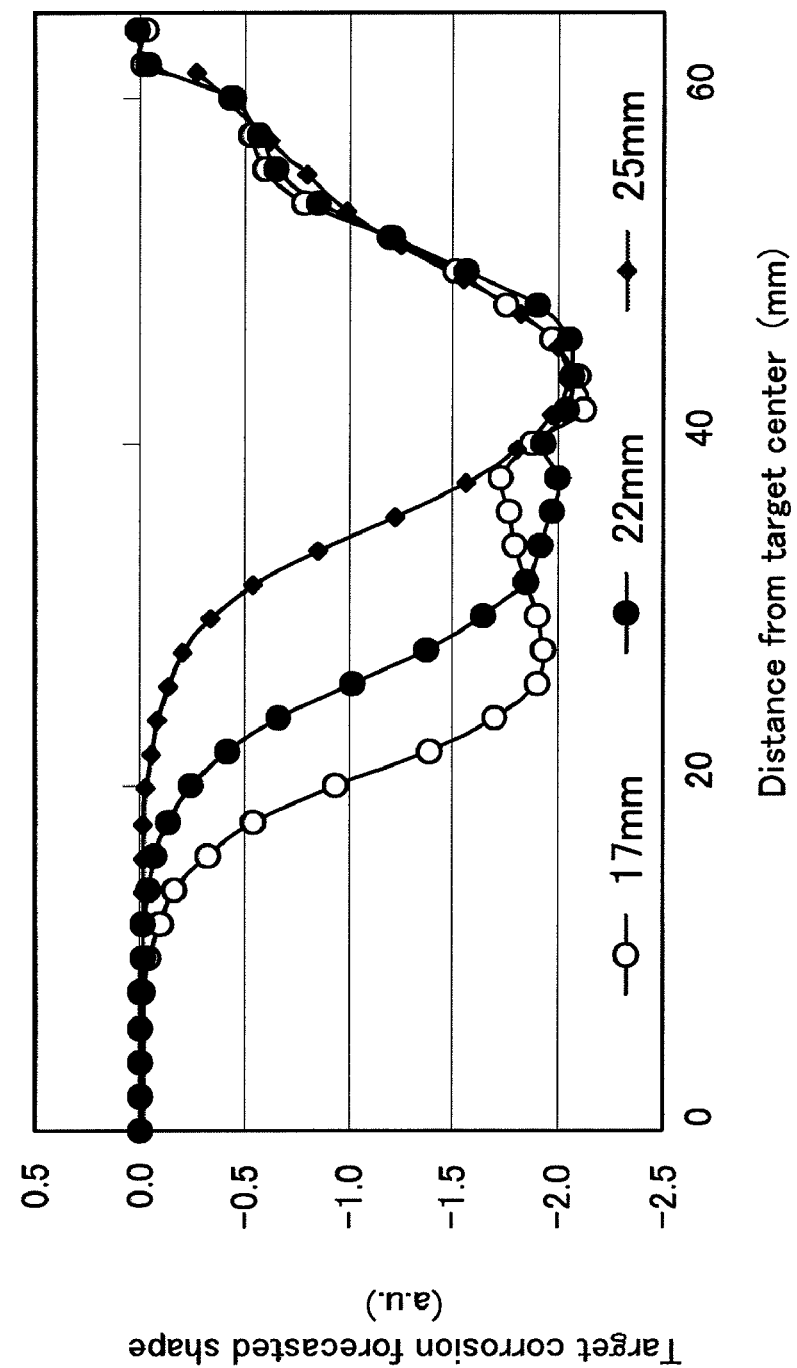
FIG. 4 is a graph showing the relation between the interval D1 between the inside parallel magnet of a magnetic circuit and the surface of a target, and the simulation result of the erosion shape of the target.

The graph shown in FIG. 4 shows the result of the simulation of the erosion shapes of the target when the intervals are constant as interval D2=32 mm, interval D3=40 mm and interval D4=35 mm; and interval D1 is changed as interval D1=25 mm, 22 mm and 17 mm. As shown in FIG. 4, it is revealed that the smaller the interval D1 becomes (25 mm→22 mm→17 mm), the wider the area where the target is eroded most (also referred to as an erosion center) becomes.

Next, the present inventors found that the generated plasma is spread even to the end of the surface of target 2 by adjusting interval D3 between perimeter perpendicular magnet 102 and the surface of target 2. In other words, plasma occurs even to the end of the surface of target 2, when interval D3 is made larger. Therefore, preferably, interval D3 is the same as interval D2, or more. On the other hand, if interval D3 is enlarged excessively, plasma may occur even to the region outside the target, and the apparatus may be damaged.

Figure 5A:
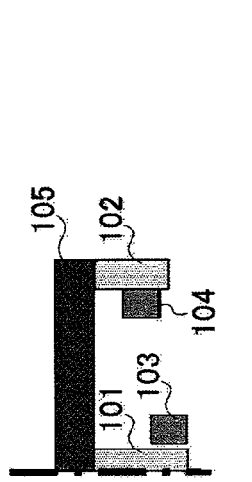
FIG. 5 is a figure showing the relation between the interval D3 between the perimeter perpendicular magnet of a magnetic circuit and the surface of a target, and plasma to be generated.
Figure 5B:
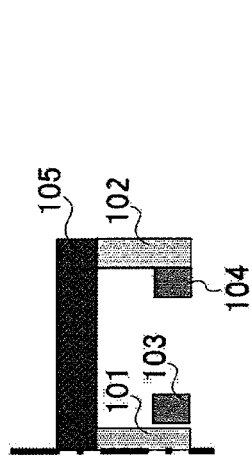
Figure 5C:
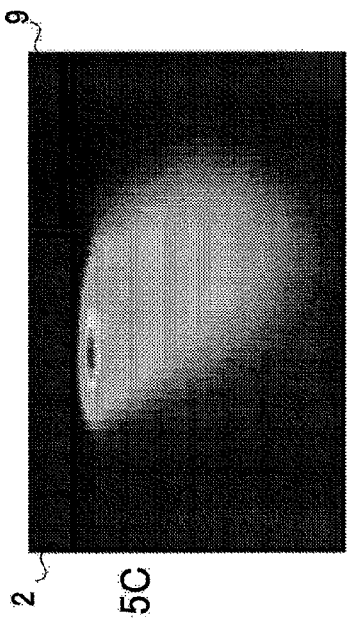
Figure 5D:
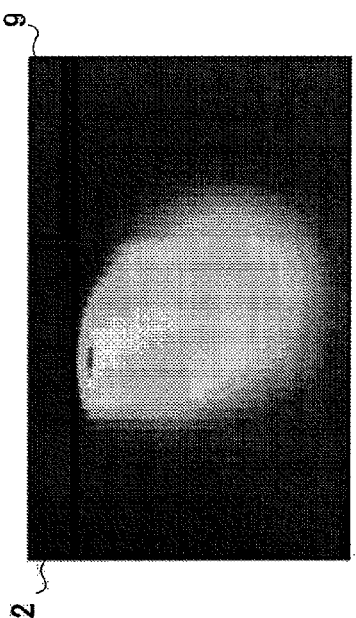
Figure 5E:
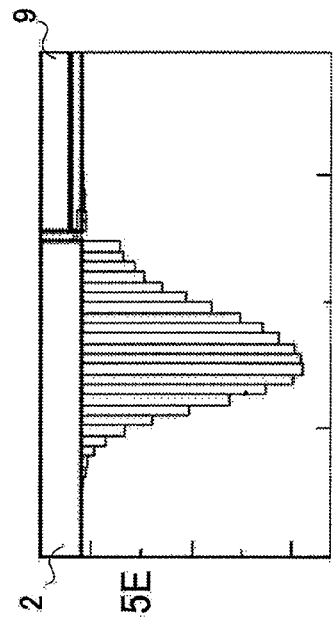
Figure 5F:
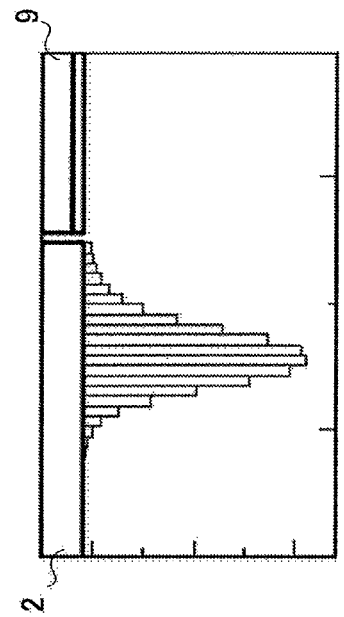

In a case using the magnetic circuit (as shown in FIG. 5A) with interval D1=interval D4=25 mm, interval D2=40 mm and interval D3=35 mm, the state of the plasma generated on the surface of target 2 is shown in FIG. 5C, and the intensity of the plasma is shown in FIG. 5E. On the other hand, in a case using the magnetic circuit (as shown in FIG. 5B) with interval D1=interval D2=interval D3=interval D4=25 mm, the state of the plasma generated on the surface of target 2 is shown in FIG. 5D, and the intensity of the plasma is shown in FIG. 5F. FIGS. 5A, 5C and 5E (interval D3=35 mm), as compared with FIGS. 5B, 5D, and 5F (interval D3=25 mm), show the plasma spreading even to the end of the surface of target 2.

In this manner, if interval D3 between perimeter perpendicular magnet 102 and the surface of target 2 is enlarged, the plasma may be spread on the surface of target 2. On the other hand, since the magnetic field formed on the surface of target 2 becomes weak if interval D3 is enlarged excessively, the supplement of electrons becomes insufficient and troubles are caused. For this reason, interval D3 is preferably approximately 40 mm or less.

Figure 6:
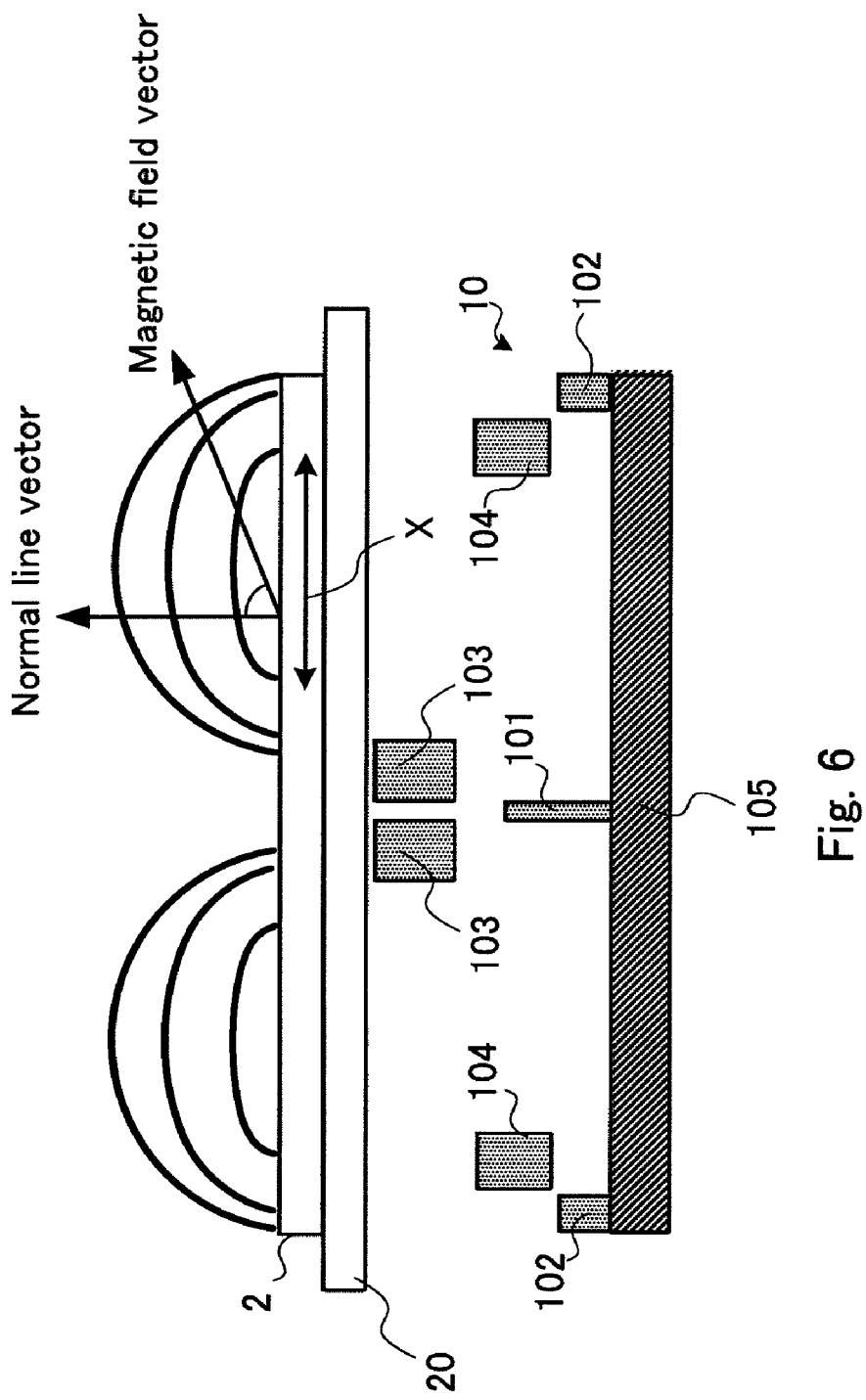
FIG. 6 is a figure for explaining the length X as an evaluation index for performing a preferred embodiment.

Furthermore, the present inventors have evaluated the magnetic circuit, while controlling the respective factors, by using "length X (refer to FIG. 6)" as an index. The "length X" used as the index is shown in FIG. 6. FIG. 6 is a cross sectional view of target 2 and packing plate 20. The length of the range at which the crossing angle of the magnetic field vector of the line of magnetic force projecting from the surface of target 2, and the normal line vector of the surface of target 2 becomes 60 degrees or more is defined as the "length X".

If this "length X" is large, a line of magnetic force roughly parallel to the surface of target 2 may be formed in a wide region near the surface of the target. Therefore, plasma can be generated in a wide region and it is considered that the use efficiency of the target materials increases.

As a result, it was found that preferably, the interval between center perpendicular magnet 101 and inside parallel magnet 103 and the interval between perimeter perpendicular magnet 102 and outside parallel magnet 104 were kept short to the extent that magnetic coupling is maintained. For example, the intervals are preferably 10 mm or less, respectively.

Further, magnets 101 to 104 may be arranged so that they do not overlap each other when seen from the normal line direction of the target surface, but they are not necessarily arranged so. For example, magnet 101 and magnet 103, or magnet 102 and magnet 104 may be arranged so that they overlap when seen from the normal line direction of the target surface.

Figure 7:
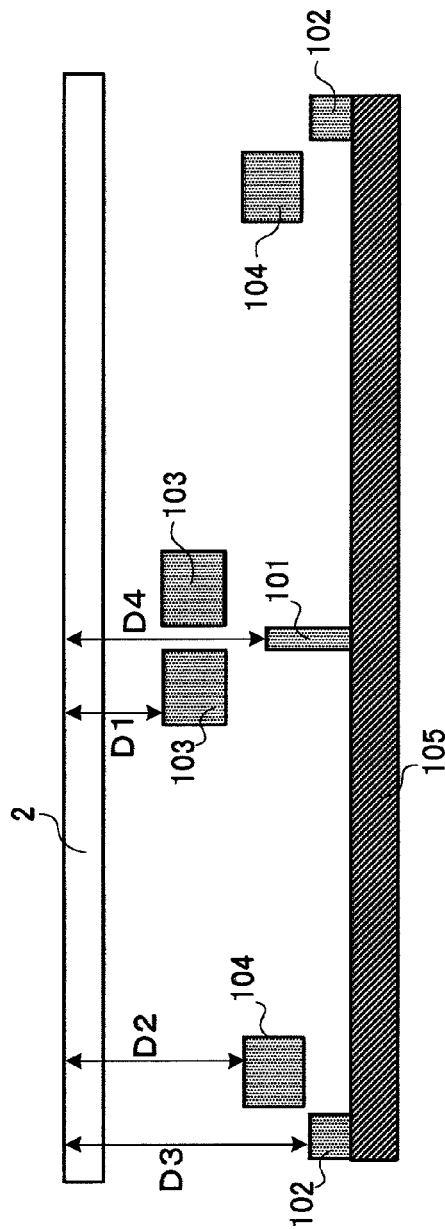
FIG. 7 is a figure showing an example of a preferred magnetic circuit.

An example of the suitable magnetic circuit obtained from considerations based on these simulations is shown in FIG. 7. The magnetic circuit shown in FIG. 7 was applied to the sputtering apparatus of Embodiment 1.

In the magnetron sputtering apparatus, it is generally easy to enlarge the interval between the magnets constituting the magnetic circuit and the target surface.

On the other hand, in the magnetron sputtering apparatus having a water-cooling jacket for cooling a target, it may be difficult to shrink the interval between the magnets constituting the magnetic circuit and the target surface in some cases. It is because due to the thickness of the water-cooling jacket, the magnetic circuit is not placed sufficiently close to the target. Moreover, although arranging the magnets in the inside of the water-cooling jacket is also considered, in order to reduce the degradation of the magnets and the burden of the maintenance, it is required to arrange the magnetic circuit in the outside of the water-cooling jacket.

However, interval D1 between inside parallel magnet 103 and the surface of target 2 is preferably set to 30 mm or less. As shown in FIG. 4, if interval D1 is 30 mm or less, plasma in a wide region near the surface of target 2, and the use efficiency of target materials is easily increased. Generally, since the thickness of target 2 is approximately 10 mm, and the thickness of packing plate 20 is approximately 5 mm, and the thickness of water-cooling jacket 11 is approximately 10 mm (25 mm in total), interval D1 may not be shrunk enough in some cases.

Figure 8:
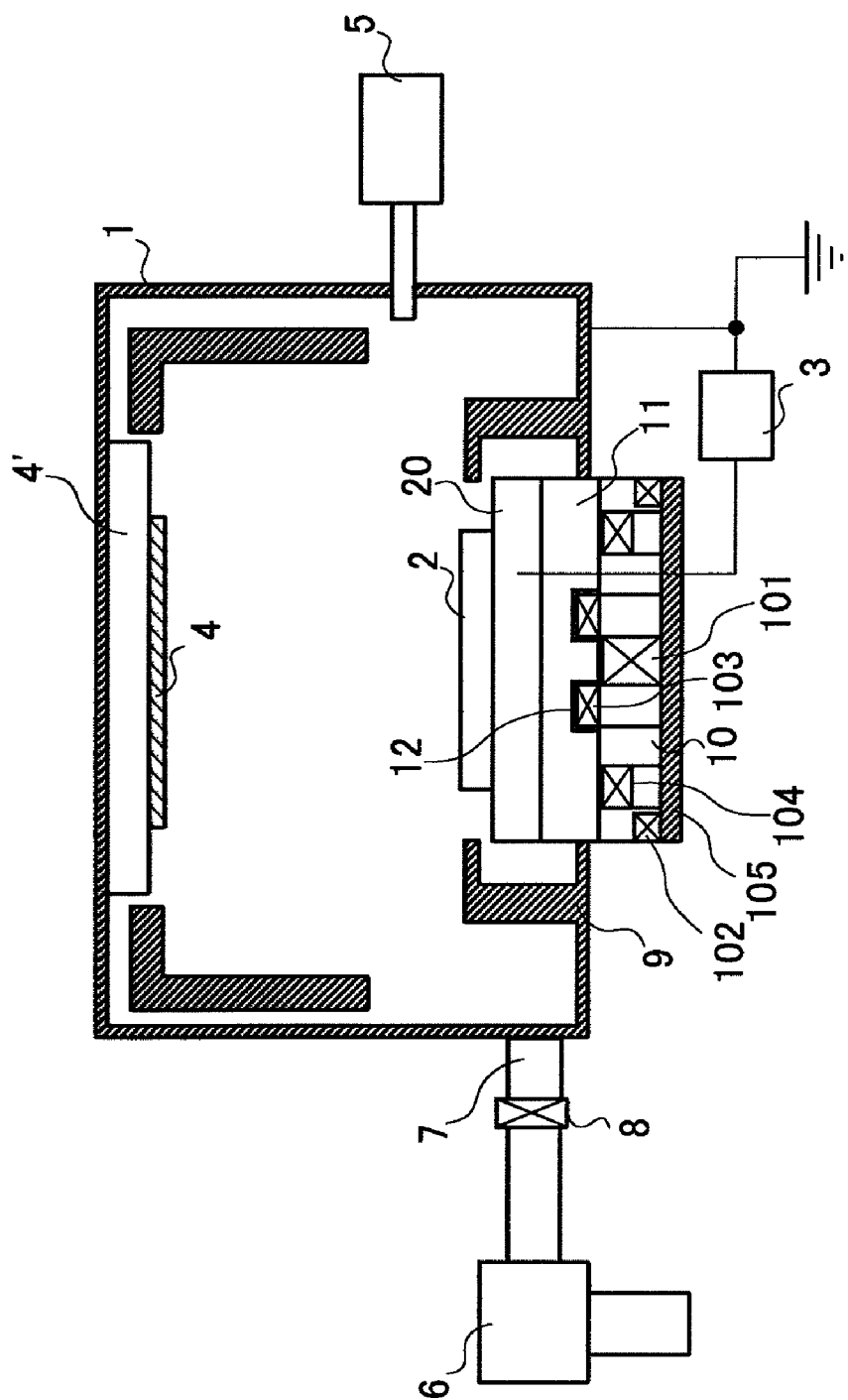
FIG. 8 is a figure showing the outline of an example (Embodiment 2) of a sputtering apparatus according to the present invention.

Therefore, water-cooling jacket 11 of the magnetron sputtering apparatus according to the present invention may have concave space 12 for arranging inside parallel magnet 103 to the side facing magnetic circuit 10 (refer to FIG. 8). By arranging inside parallel magnet 103 in concave space 12, interval D1 can be shrunk (for example, 30 mm or less).

Furthermore, concave space 12 for arranging inside parallel magnet 103 may be divided into two or more spaces (refer to FIG. 9). In other words, preferably, concave spaces 12 is divided by slits 14, and slits 14 are functioned as channels.

2. Sputtering method according to the present invention:
When the sputtering apparatus according to the present invention is used, a metal sputter film is prepared on the substrate surface, by the usual sputtering technique. Hereinafter, the sputtering method according to the present invention is explained with reference to the sputtering apparatus shown in FIG. 1.

First, substrate 4 that is a film-formed body on which a sputter film is formed is held by substrate holder 4'. Next, through exhaust port 7, the inside of vacuum chamber 1 is made into high vacuum, and then sputtering gas whose flow rate is controlled constant is introduced into the inside of vacuum chamber 1 through gas introduction apparatus 5. Sputtering gas is generally rare gas (inactive gas) such as Ar, Xe and the like.

A negative bias voltage is applied to target 2 and packing plate 20. Thereby, an electric field in the direction perpendicular to the surface of target 2 occurs. With magnetic circuit 10, on the surface of target 2, a magnetic field that is roughly parallel to the surface of target 2 occurs. Therefore, in the portion where the magnetic field and the electric field cross perpendicularly, a magnetron discharge occurs, and then plasma occurs. Consequently, target 2 is sputtered, and sputtered target components adhere to the substrate, and then a sputter film is formed.

In this manner, when the magnetic field (line of magnetic force) is formed parallel to the surface of target 2 in the region as widely as possible near the surface of target 2, plasma may be generated in a wide region near the surface of target 2. If plasma is generated in a region near the surface of target 2, the wide range of the surface of target 2 may be sputtered, and therefore, the material use efficiency may be increased.

Hereinafter, examples of Embodiments according to the present invention are explained with reference to the attached drawings.

Embodiment 1

FIG. 1 is a schematic view of a sputtering apparatus of Embodiment 1 according to the present invention. The sputtering apparatus shown in FIG. 1 includes vacuum chamber 1, a magnetron electrode containing target 2 and water-cooling jacket 11 and magnetic circuit 10, and substrate 4.

In vacuum chamber 1, gas introduction apparatus 5, exhauster 6, exhaust port 7, and valve 8 are provided. Exhauster 6 carries out negative pressure in the inside of vacuum chamber 1. Gas introduction apparatus 5 introduces sputtering gas into the inside of vacuum chamber 1. Sputtering gas is generally inactive gas such as Ar gas and the like.

The magnetron electrode has target 2 composed of a film material, high voltage impression power supply 3 connected to target 2, and magnetic circuit 10 arranged on the back surface (surface opposite to the surface where substrate 4 is arranged) side of target 2. Water-cooling jacket 11 is arranged between magnetic circuit 10 and target 2. In addition, target 2 is stuck onto packing plate 20. Further, ground shield 9 is arranged around the magnetron electrode. The material of the target may be arbitrarily selected according to the components of the film to be formed.

Furthermore, substrate 4 is held by substrate holder 4', and is installed in the position opposing target 2.

Magnetic circuit 10 has a perpendicular magnet unit composed of center perpendicular magnet 101 and perimeter perpendicular magnet 102, a parallel magnet unit composed of inside parallel magnet 103 and outside parallel magnet 104, yoke 105 that magnetically combines center perpendicular magnet 101 and perimeter perpendicular magnet 102.

Figure 10:
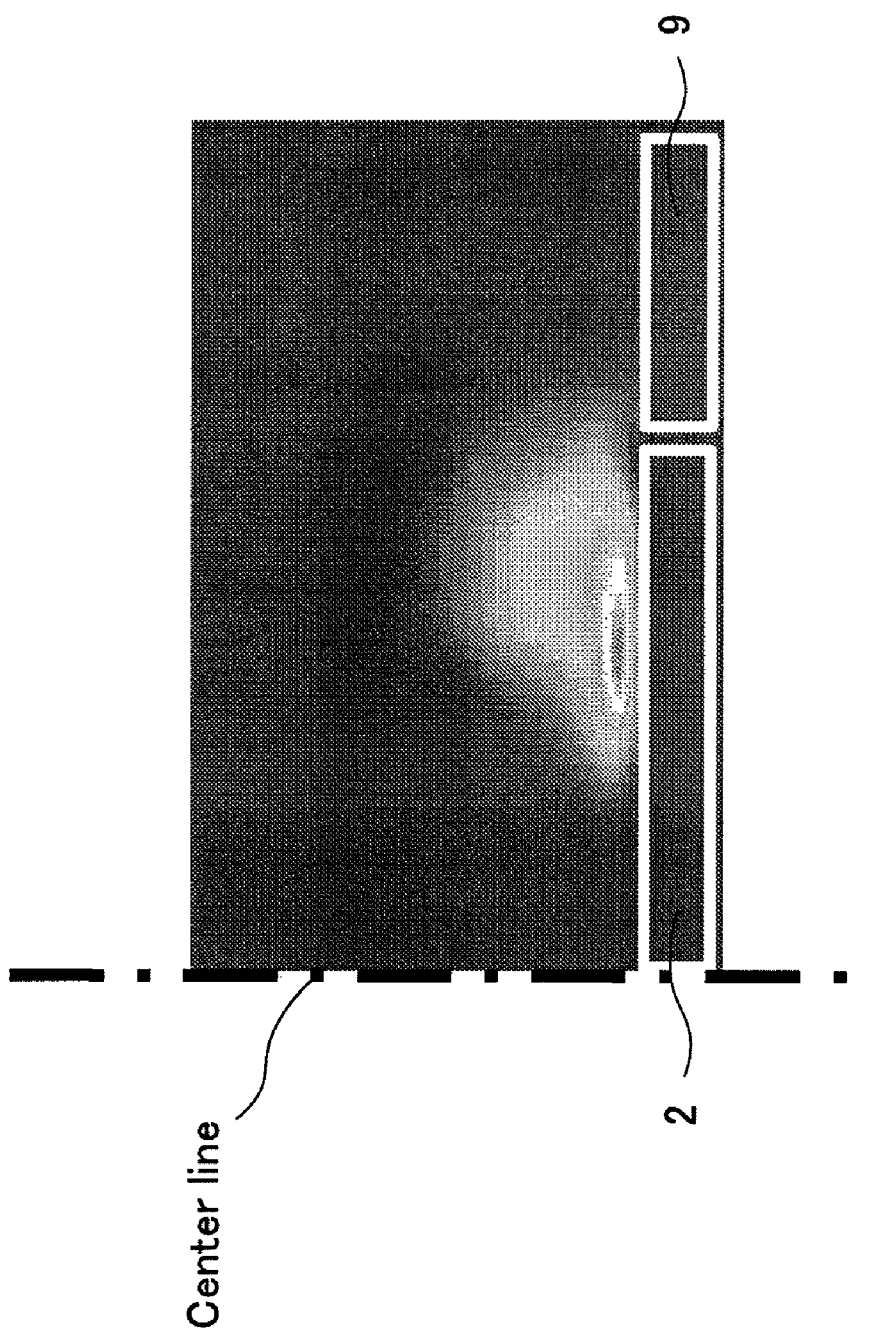
FIG. 10 is a figure showing a plasma distribution generated by a magnetic circuit according to the present invention.

Magnetic circuit 10 is set as the magnetic circuit shown in FIG. 7 (magnetic circuit according to the present invention). The analysis result of the plasma distribution generated in this case is shown in FIG. 10. The analysis of plasma distribution was conducted under the conditions in which 0.325 Pa of Ar gas is introduced into the magnetic field, and a DC high voltage of −400V is applied to target 2. In addition, the target erosion shape expected from Ar ion flux that enters the surface of target 2 is shown in FIG. 12 (curve A; the horizontal axis r shows the distance from the target center).

Figure 11:
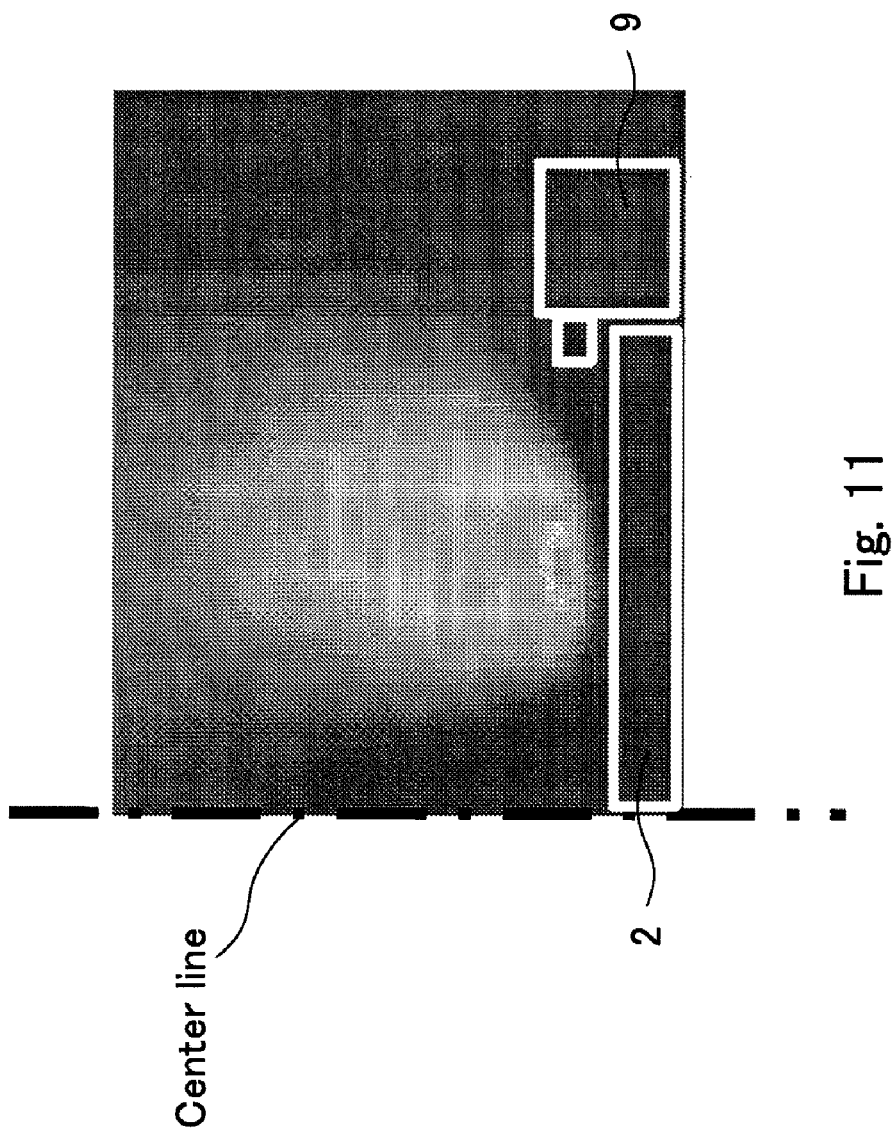
FIG. 11 is a figure showing a plasma distribution generated by a magnetic circuit according to the prior art.

On the other hand, magnetic circuit 10 is set as the conventional magnetic circuit (composed of only magnet 101 and magnet 102 that are perpendicular magnet unit by omitting magnet 103 and magnet 104 that are the parallel magnet unit). The analysis result of the plasma distribution generated in this case is shown in FIG. 11. The analysis of the plasma distribution was conducted under the conditions in which 0.325 Pa of Ar gas is introduced into the magnetic field, and a DC high voltage of −400V is applied to target 2. In addition, the target erosion shape expected from Ar ion flux that enters the surface of target 2 is shown in FIG. 12 (curve B). Further, the line of magnetic force of the magnetic field formed when used the conventional magnetic circuit is shown in FIG. 13.

When the conventional magnetic circuit is used, as shown in FIG. 11, plasma is generated locally in the region between the magnets of the perpendicular magnet unit of the magnetic circuit. On the other hand, when the magnetic circuit (FIG. 7) according to the present invention is used, as shown in FIG. 10, plasma distribution is spread obviously.

Figure 12:
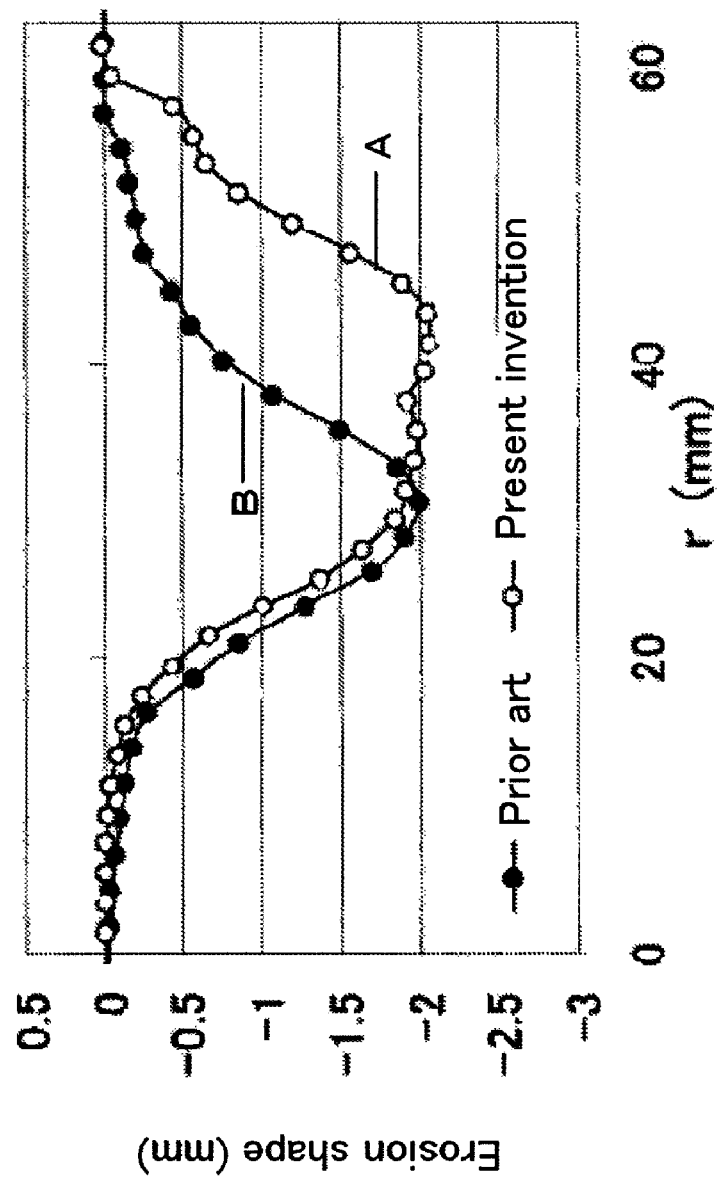
FIG. 12 is a figure showing target erosion shapes when sputtering is carried out with the use of a magnetic circuit according to the present invention or a magnetic circuit according to the prior art.
Figure 13:
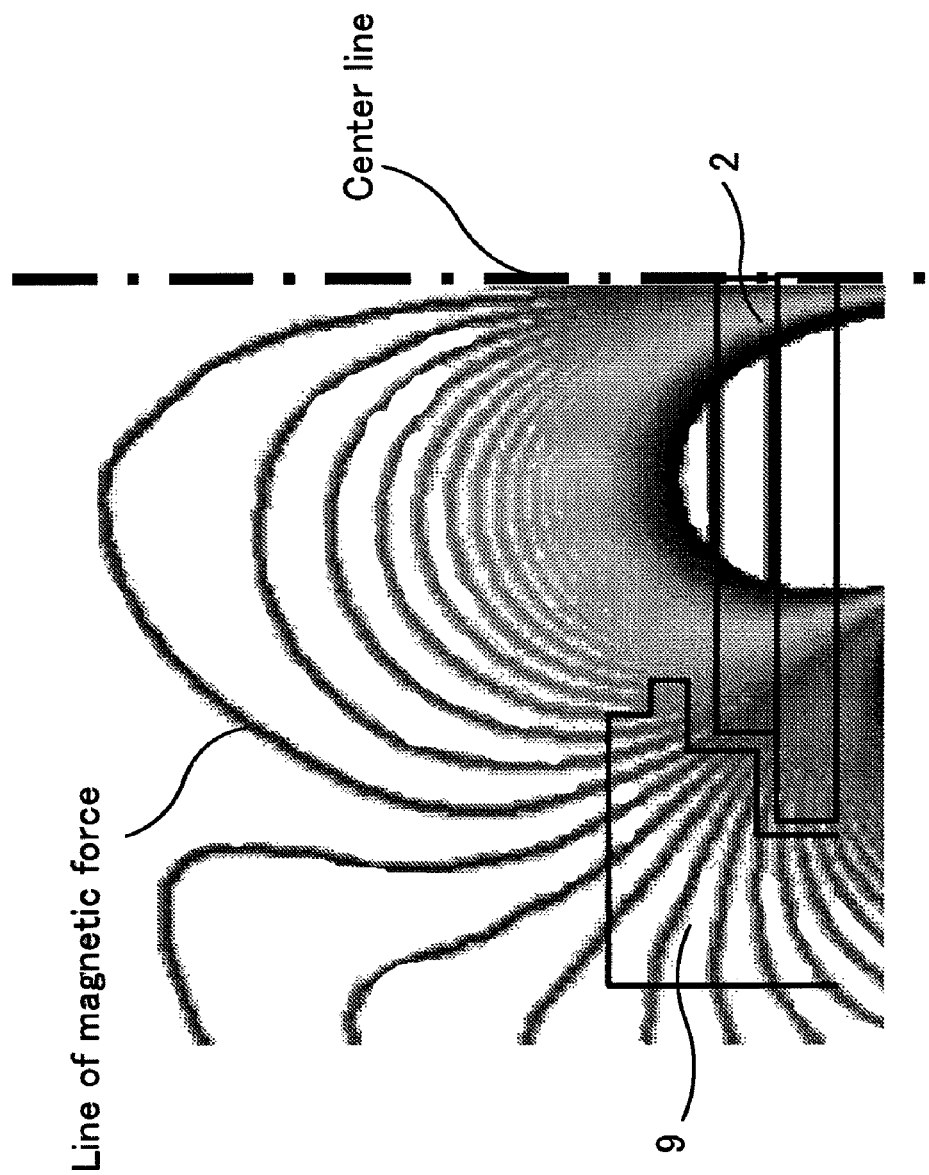
FIG. 13 is a figure showing the shape of the line of magnetic force generated by a magnetic circuit according to the prior art.

Further, as shown in FIG. 12, it was found that while the target erosion shape is one-sided (curve B) when the conventional magnetic circuit is used, the target erosion shape (curve A) is spread when the magnetic circuit of the present invention is used. Concretely, the use efficiency of the target material obtained from the curve B is approximately 16%, meanwhile, the use efficiency of the target material obtained from the curve A is approximately 40%, which makes twice or more the improvement.

As mentioned above, according to Embodiment 1, since plasma that spreads in a wide region is formed, the use efficiency of the target material may be increased.

Embodiment 2

FIG. 8 is a schematic view of a sputtering apparatus of Embodiment 2 according to the present invention. In FIG. 8, the same numerals are given to the same components as in FIG. 1, and the repeated explanations thereof are omitted herein.

In the sputtering apparatus shown in FIG. 8, water-cooling jacket 11 is arranged between target 2 and magnetic circuit 10 in the same manner as in Embodiment 1. Concave space 12 is arranged in the magnetic circuit side of water-cooling jacket 11. Inside parallel magnet 103 enters concave space 12, and interval D1 between magnet 103 and the surface of target 2 is shrunk.

Since portions other than concave space 12 of water-cooling jacket 11 are kept thicker than the portion of space 12, the flow of cooling water is easily secured.

In the sputtering apparatus of Embodiment 2, for example, the thickness of target 2 is 5 mm, and the thickness of packing plate 20 is 10 mm. And more, the thickness of the portion of water-cooling jacket 11 on which concave space 12 is formed is 7 mm, and the thickness of other portions is 14 mm. According to this arrangement, the interval between magnet 103 and the surface of target 2 is kept 22 mm, and the thickness of portions other than concave space 12 of water-cooling jacket 11 is set to the sufficient thickness (14 mm). Therefore, the heat exchange capability by water cooling of the water-cooling jacket is sufficiently secured.

As mentioned above, according to the sputtering apparatus of Embodiment 2, even if a high output is impressed to the target, the heat exchange capability by a water-cooling jacket is maintained without being impaired. Of course, in the same manner as the sputtering apparatus of Embodiment 1, since plasma is formed in a wide region near the surface of target 2, the use efficiency of the target material may be increased.

Embodiment 3

Figure 9A:
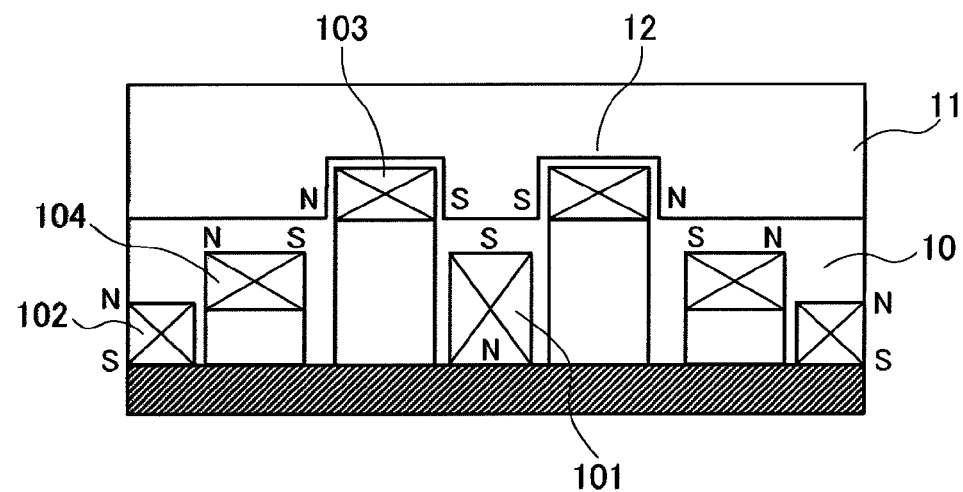
FIG. 9 is a figure showing the outline of a magnetron electrode in an example (Embodiment 3) of a sputtering apparatus according to the present invention.
Figure 9B:
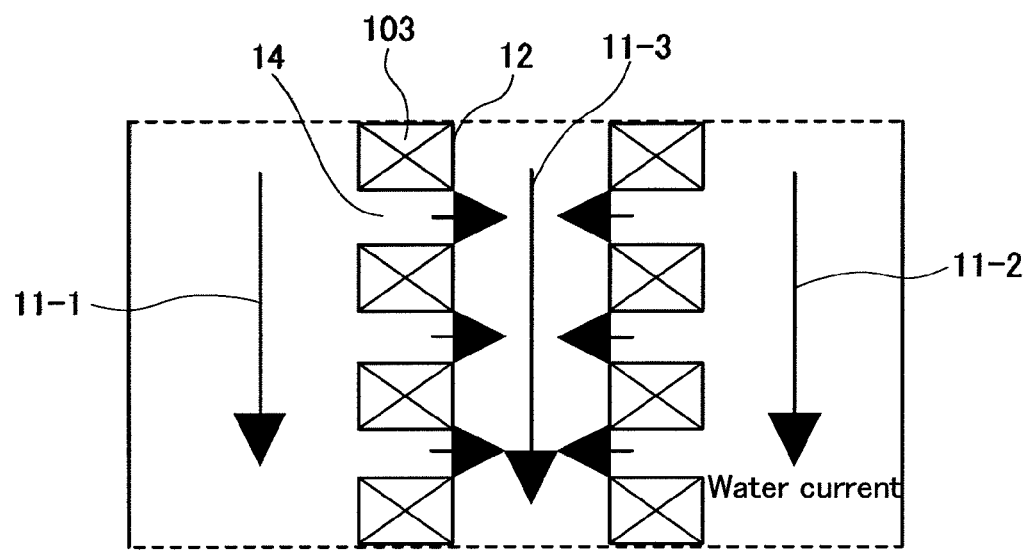

FIG. 9A and FIG. 9B are schematic views of a magnetron electrode (only magnetic circuit 10 and water-cooling jacket 11) of a sputtering apparatus of Embodiment 3 according to the present invention. FIG. 9A is a cross sectional view of water-cooling jacket 11, and FIG. 9B is a top view of water-cooling jacket 11 when seen from the normal line direction of the back surface of the target. In FIG. 9A and FIG. 9B, the same numerals are given to the same components as in FIG. 1, and the repeated explanations thereof are omitted herein.

In the sputtering apparatus of Embodiment 3, in the same manner as in the sputtering apparatus of Embodiment 2, concave space 12 is arranged in part of water-cooling jacket 11, in order to shrink interval D1 between magnet 103 and the surface of target 2 (refer to FIG. 9A). Further, concave space 12 formed in water-cooling jacket 11 is divided into plural spaces by slits 14 (FIG. 9B). In other words, magnet 103 is also divided, provided in respective spaces 12, and arranged close to the surface of target 2.

Slits 14 that divide concave space 12 function as channels of cooling water, and allow interconnecting between respective portions (11-1, 11-2, 11-3) of the water-cooling jacket mutually. Since the thickness of water-cooling jacket 11 becomes small due to concave space 12, there is a risk that the conductance to the cooling water may decrease. However, water-cooling jacket 11 of the sputtering apparatus of Embodiment 3 easily secures the flow of the cooling water and prevents the cooling capability from decreasing.

As mentioned above, in the sputtering apparatus of Embodiment 3, the heat exchange capability of the water-cooling jacket is maintained without being impaired. Therefore, the expansion and contraction of the target by ON/OFF of electric discharges is prevented, and peeling by the stress of the substances that re-adhere to the target may be reduced. And more, dust control is also easily. Therefore, the sputtering apparatus of Embodiment 3 is preferably applied also to a sputtering apparatus that impresses a high output.

Of course, in the same manner as in the sputtering apparatus of Embodiment 1, since plasma is formed in a wide region near the surface of the target, the use efficiency of the target material may be increased.

Embodiment 4

Figure 14:
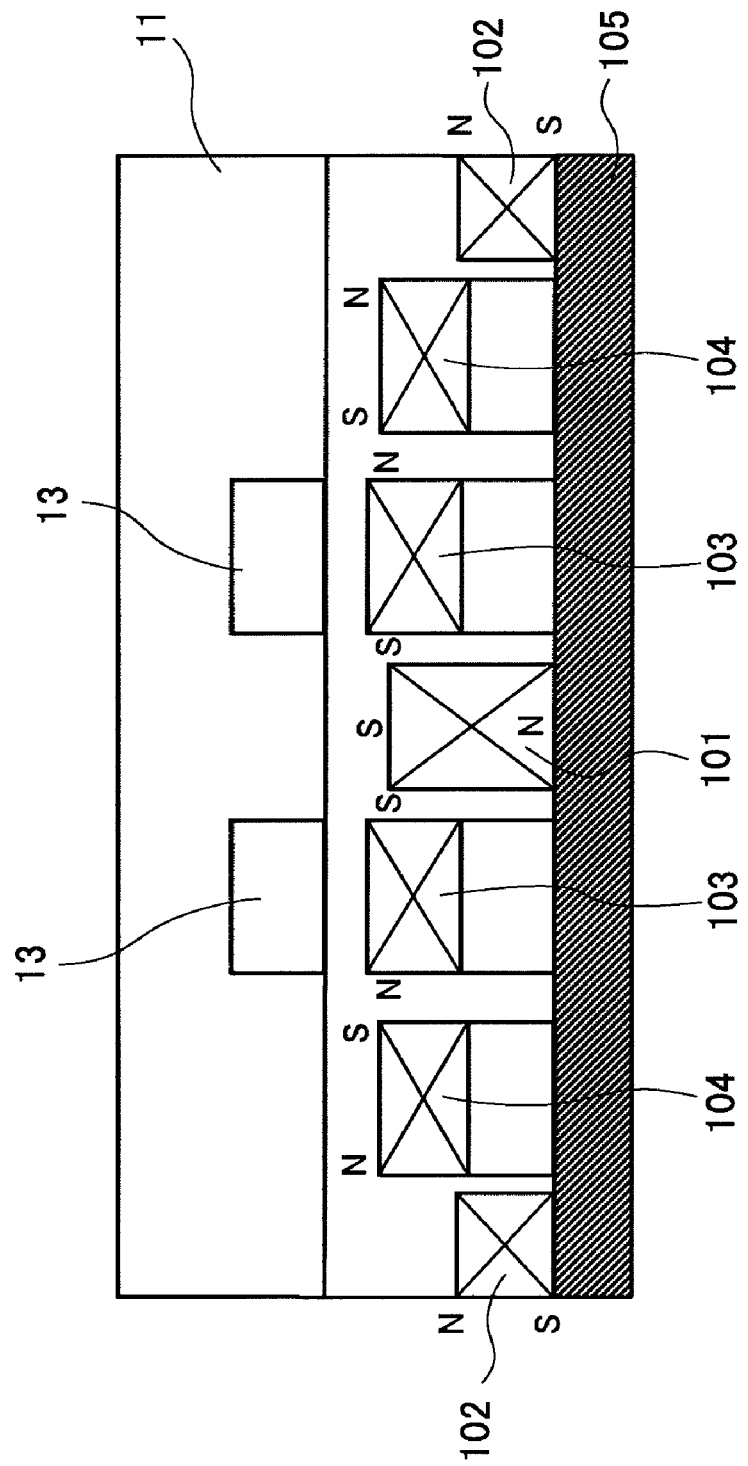
FIG. 14 is a figure showing the outline of a magnetron electrode in an example (Embodiment 4) of a sputtering apparatus according to the present invention.

FIG. 14 is a schematic view of a magnetron electrode (only water-cooling jacket 11 and magnetic circuit 10) of a sputtering apparatus of Embodiment 4. In FIG. 14, the same numerals are given to the same components as in FIG. 1, and the repeated explanations thereof are omitted herein.

The sputtering apparatus of Embodiment 4 has magnetic circuit component 13 (magnetic substance) arranged in the inside of water-cooling jacket 11. Magnetic circuit component 13 magnetically combines with magnet 103 of magnetic circuit 10, and functions as one magnetic component. Therefore, the same effect as in the case where magnet 103 itself is arranged close to target 2 is expected. Further, instead of arranging magnetic circuit component 13 in the inside of water-cooling jacket 11, the material of water-cooling jacket 11 only in the vicinity of magnet 103 may be set as a magnetic substance.

In the sputtering apparatus of Embodiment 4, for example, the thickness of the target is 5 mm, and the thickness of packing plate 20 is 10 mm (refer to FIG. 3). In this case, magnetic circuit component 13 is arranged in the inside of water-cooling jacket 11. Since magnetic circuit component 13 (magnetic substance) contacts with the cooling water, the maintenance such as exchange and the like may be required in some cases. However the magnetic body is of lower costs and longer life in comparison with the magnet, therefore, the burden of the maintenance is low. Further, magnetic circuit component 13 (magnetic substance) may be made of a stainless steel-based material, or may be an iron-based material coated with resin paint, Ni plating and the like so as to increase the anticorrosion. As a result, the service life of component 13 can be prolonged.

As mentioned above, according to Embodiment 4, a sputtering apparatus that is simple and inexpensive, and of low cost and easy maintenance characteristic, may be provided. Of course, in the same manner as in Embodiment 1, since plasma is formed in a wide region near the surface of the target, the use efficiency of the target material may be increased.

According to the sputtering apparatus and the sputtering method of the present invention, the use efficiency of the target material is increased, and a sputtered thin film may be produced inexpensively. In addition, by generating plasma in a wide region near the surface of a target, film re-adhesion on the target surface is prevented. And more, a sputtering thin film with the sufficient quality in which dusts are reduced may be provided through preventing abnormal electric discharges. Therefore, according to this invention, an antireflection film on the surface of an optical component can be formed inexpensively and at high quality. And more, it is useful as an apparatus for forming not only an optical thin film but also various thin films.

1 Vacuum chamber
2 Target
3 High voltage impression power supply
4 Substrate
4' Substrate holder
5 Gas introduction apparatus
6 Exhauster
7 Exhaust port
8 Valve
9 Ground shield
10 Magnetic circuit
11 Water-cooling jacket
12 Space
13 Magnetic circuit component (magnetic body)
14 Slit
20 Packing plate
101 Center perpendicular magnet
102 Perimeter perpendicular magnet
103 Inside parallel magnet
104 Outside parallel magnet
105 Yoke

What is claimed is:

1. A sputtering apparatus comprising a vacuum chamber, a target arranged in the vacuum chamber, a magnetic circuit arranged on a back surface side of the target and containing a perpendicular magnet unit and a parallel magnet unit, and a substrate holder arranged on a front surface side of the target and for holding a substrate;
    the perpendicular magnet unit composed of a center perpendicular magnet and a perimeter perpendicular magnet, and
    directions of magnetic fields of both magnets of the perpendicular magnet unit being roughly perpendicular to the target surface, and directions of magnetic fields of the center perpendicular magnet and the perimeter perpendicular magnet being opposite each other, and
    the center perpendicular magnet being installed in central part of a back surface of the target, and the perimeter perpendicular magnet being annularly installed in perimeter part of the back surface of the target so as to surround the center perpendicular magnet;
    the parallel magnet unit composed of an inside parallel magnet and an outside parallel magnet, and
    directions of magnetic fields of both magnets of the parallel magnet unit being roughly parallel to the target surface, and directions of magnetic fields of the inside parallel magnet and the outside parallel magnet being the same each other, and
    both magnets of the parallel magnet unit being annularly installed between the center perpendicular magnet and the perimeter perpendicular magnet so as to surround the center perpendicular magnet, and the inside parallel magnet being arranged in the position closer to a central side of the back surface of the target than the outside parallel magnet; and
    when an interval between the inside parallel magnet and the surface of the target being defined as D1, an interval between the outside parallel magnet and the surface of the target being defined as D2, and an interval between the perimeter perpendicular magnet and the surface of the target being defined as D3, $D1<D2\leqq D3$ being satisfied.

2. The sputtering apparatus according to claim 1, wherein the interval D1 is 30 mm or less.

3. The sputtering apparatus according to claim 1, further including a water-cooling jacket arranged between the target and the magnetic circuit, and
    the magnetic circuit is arranged outside the water-cooling jacket.

4. The sputtering apparatus according to claim 3, wherein a concave space is formed in part of the surface of the water-cooling jacket being faced the magnetic circuit and the inside parallel magnet is arranged in the concave space.

5. The sputtering apparatus according to claim 4, wherein the space formed in the part of the surface of the water-cooling jacket being faced the magnetic circuit is divided into plural spaces by slits, and the inside parallel magnet is arranged in each of the plural spaces, and
    thickness of the slits is larger than the thickness of a portion of the water-cooling jacket in which the concave is formed, and the slits constitute part of water channels of the water-cooling jacket.

6. The sputtering apparatus comprising a vacuum chamber, a target arranged in the vacuum chamber, a magnetic circuit arranged on a back surface side of the target and containing a perpendicular magnet unit and a parallel magnet unit, a substrate holder arranged on a front surface side of the target and for holding a substrate, and a water-cooling jacket arranged between the target and the magnetic circuit;
    the perpendicular magnet unit composed of a center perpendicular magnet and a perimeter perpendicular magnet, and
    directions of magnetic fields of both magnets of the perpendicular magnet unit being roughly perpendicular to the target surface, and directions of magnetic fields of the center perpendicular magnet and the perimeter perpendicular magnet being opposite each other, and
    the center perpendicular magnet being installed in central part of a back surface of the target, and the perimeter perpendicular magnet being annularly installed in perimeter part of the back surface of the target so as to surround the center perpendicular magnet;

the parallel magnet unit composed of an inside parallel magnet and an outside parallel magnet, and directions of magnetic fields of both magnets the parallel magnet unit being roughly parallel to the target surface, and directions of magnetic fields of the inside parallel magnet and the outside parallel magnet being the same each other, and both magnets of the parallel magnet unit being annularly installed between the center perpendicular magnet and the perimeter perpendicular magnet so as to surround the center perpendicular magnet, and the inside parallel magnet being arranged in the position closer to a central side of the back surface of the target than the outside parallel magnet; and a magnetic substance being installed inside the water-cooling jacket corresponding to the inside parallel magnet, or part of the water-cooling jacket corresponding to the inside parallel magnet being a magnetic substance.

7. A sputtering method using the sputtering apparatus according to claim 1, comprising a step of holding a film-formed body on the substrate holder;

a step of introducing sputtering gas into the vacuum chamber of the sputtering apparatus; and a step of forming a sputtering film on the substrate by applying a voltage to the target arranged in the chamber to generate plasma.

8. A sputtering method using the sputtering apparatus according to claim 6, comprising:

a step of holding a film-formed body on the substrate holder;

a step of introducing sputtering gas into the vacuum chamber of the sputtering apparatus; and a step of forming a sputtering film on the substrate by applying a voltage to the target arranged in the chamber to generate plasma.

* * * * *